(12) United States Patent
Hamann et al.

(10) Patent No.: US 8,129,883 B2
(45) Date of Patent: Mar. 6, 2012

(54) PIEZOELECTRIC STACK AND METHOD FOR PRODUCING A PIEZOELECTRIC STACK

(75) Inventors: Christoph Hamann, Thalmassing (DE); Harald Johannes Kastl, Fichtelberg (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 12/527,602

(22) PCT Filed: Feb. 19, 2008

(86) PCT No.: PCT/EP2008/051964
§ 371 (c)(1),
(2), (4) Date: Jan. 25, 2010

(87) PCT Pub. No.: WO2008/101908
PCT Pub. Date: Aug. 28, 2008

(65) Prior Publication Data
US 2010/0225204 A1  Sep. 9, 2010

(30) Foreign Application Priority Data
Feb. 19, 2007 (DE) .................. 10 2007 008 120

(51) Int. Cl.
*H01L 41/08* (2006.01)
(52) U.S. Cl. ....................... 310/328; 310/366
(58) Field of Classification Search .......... 310/328, 310/366
See application file for complete search history.

(56) References Cited

U.S. PATENT DOCUMENTS

| | | | | |
|---|---|---|---|---|
| 5,196,757 A | * | 3/1993 | Omatsu | 310/358 |
| 5,245,734 A | * | 9/1993 | Issartel | 29/25.35 |
| 7,358,655 B2 | | 4/2008 | Ragossnig et al. | |
| 7,843,114 B2 | * | 11/2010 | Dollgast et al. | 310/328 |
| 2006/0181178 A1 | * | 8/2006 | Kastl et al. | 310/328 |
| 2006/0238073 A1 | * | 10/2006 | Ragossnig et al. | 310/328 |
| 2007/0269667 A1 | * | 11/2007 | Kobayashi et al. | 428/469 |

FOREIGN PATENT DOCUMENTS

| | | |
|---|---|---|
| DE | 10307825 A1 | 9/2004 |
| DE | 102005025717 A1 | 12/2006 |
| JP | 2001102646 A | 4/2001 |
| JP | 2005085817 A | 10/2005 |
| WO | WO2005/067871 A | 6/2006 |
| WO | WO2006/077245 A1 | 7/2006 |

OTHER PUBLICATIONS

International Search Report, PCT/EP2008/051964, 12 pages, Jun. 12, 2006.
German Office Action, German application No. 10 2007 008 120.2-33, 3 pages, Jan. 30, 2008.

* cited by examiner

*Primary Examiner* — Mark Budd
(74) *Attorney, Agent, or Firm* — King & Spalding L.L.P.

(57) ABSTRACT

A piezoelectric stack (1) has alternately successive piezoelectric layers (2) and inner electrode layers (3, 4) which are alternately electrically connected to two outer electrodes (7, 8) which are arranged on the outer side (5, 6) of the piezoelectric stack (1). The piezoelectric stack (1) also has at least one safety layer (9, 40, 50) which is arranged between two successive piezoelectric layers (2) instead of one of the inner electrode layers (3, 4). The safety layer (9, 40, 50) is structured in such a manner that it has an internal interruption (13, 44, 45, 53) which is configured in such a manner that the safety layer (9, 40, 50) does not form an electrical contact between the two outer electrodes (7, 8) if it contact-connects both outer electrodes (7, 8) and is electrically conductive.

6 Claims, 3 Drawing Sheets

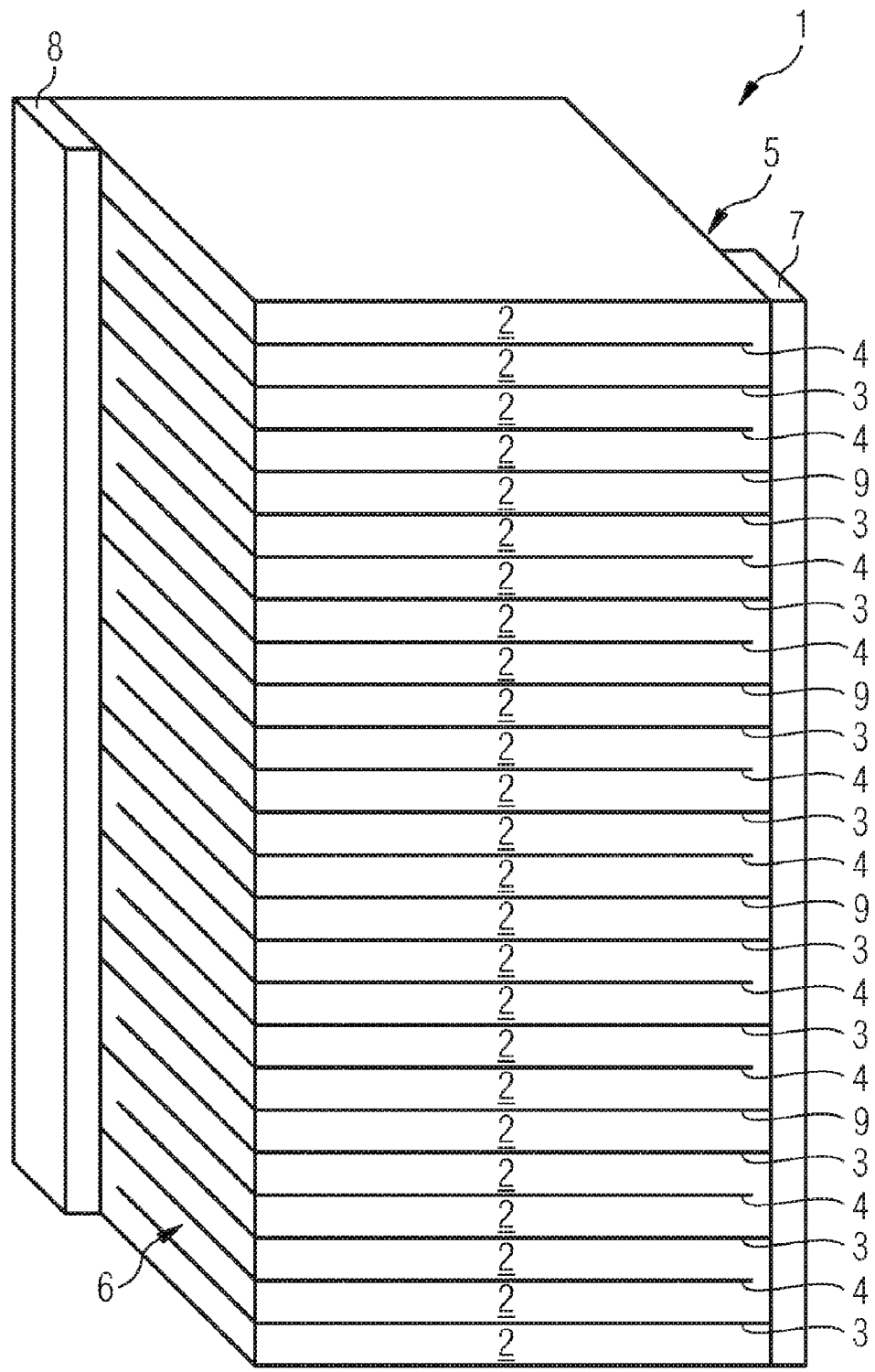

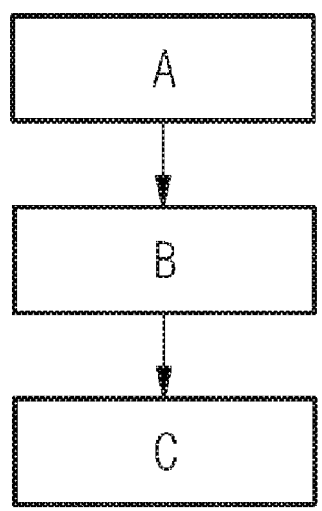
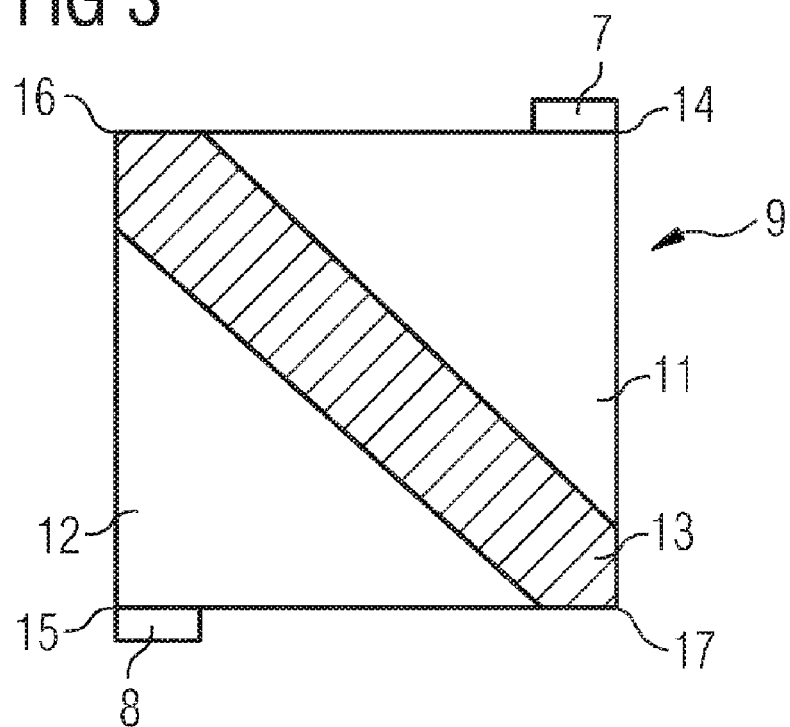

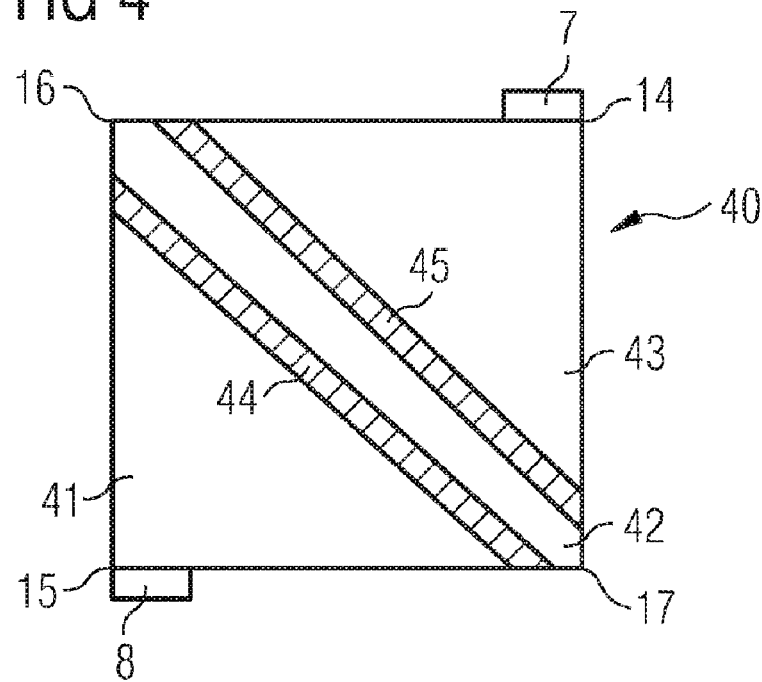
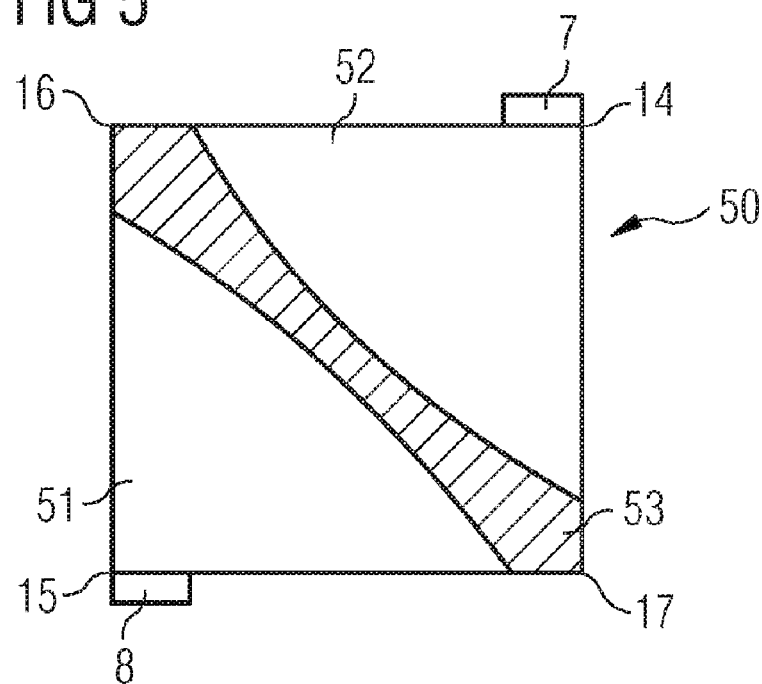

PIEZOELECTRIC STACK AND METHOD FOR PRODUCING A PIEZOELECTRIC STACK

CROSS-REFERENCE TO RELATED APPLICATIONS

This application is a U.S. National Stage Application of International Application No. PCT/EP2008/051964 filed Feb. 19, 2008, which designates the United States of America, and claims priority to German Application No. 10 2007 008 120.2 filed Feb. 19, 2007, the contents of which are hereby incorporated by reference in their entirety.

TECHNICAL FIELD

The invention relates to a piezo stack and to a method for producing a piezo stack.

BACKGROUND

Piezo elements are used, inter alia, for positioning elements, ultrasonic transducers, sensors and in inkjet printers. The function of a piezo element is based on the deformation of piezoceramic materials such as, for example, lead-zirconate-titanate, under the effect of an electrical field. If an electrical voltage is applied to the piezo element, said element expands in the perpendicular direction with respect to the electrical field which is generated by the electrical voltage.

The advantages of piezo elements are, inter alia, their relatively high speed, their relatively high degree of effectiveness and their relatively short actuation path when they are used as a piezo actuator.

However, if a relatively large actuation path is to be brought about with the piezo actuator, a piezo stack composed of a plurality of alternately successive piezoelectric layers and internal electrode layers is used for the piezo actuator.

In order to prevent the expansion of the piezo stack causing the possible occurrence of damaging fractures in the piezo stack in the transverse direction with respect to the internal electrode layers, mechanical stress within the piezo stack which is due to the expansion should remain below a level which is non-damaging for the piezoceramic material. This can be achieved, for example, by dividing the piezo stack into relatively short sections.

SUMMARY

According to various embodiments, a piezo stack can be specified in which, on the one hand, the formation of fractures is induced in a selective fashion and which, on the other hand, is embodied in a relatively operationally reliable fashion.

According to other embodiments, a method for producing such a piezo stack can be specified.

According to one embodiment, a piezo stack may have alternately successive piezoelectric layers and internal electrode layers which are alternately connected electrically to two external electrodes which are arranged on the outer side of the piezo stack, and at least one safety layer which is arranged between two successive piezoelectric layers instead of one of the internal electrode layers, wherein the safety layer is structured in such a way that it has an internal interruption which is embodied in such a way that the safety layer does not form an electrical contact between the two external electrodes if it makes contact with both external electrodes and is electrically conductive.

According to a further embodiment, the safety layer may extend essentially over the entire cross-sectional area of the piezo stack. According to a further embodiment, the interruption may be embodied as at least one gap within the safety layer. According to a further embodiment, the safety layer can be fabricated from an electrically insulating material. According to a further embodiment, the safety layer can be electrically conductive at first and becomes electrically insulating through the diffusing away of conductive components. According to a further embodiment, the safety layer may be less strong than the internal electrode layers.

According to another embodiment, in a method for producing a piezo stack which has alternately successive piezoelectric layers and internal electrode layers which are alternately connected electrically to two external electrodes which are arranged on the outer side of the piezo stack, at least one safety layer is arranged between two successive piezoelectric layers instead of one of the internal electrode layers, wherein the safety layer is structured in such a way that it has an internal interruption which is embodied in such a way that the safety layer does not form an electrical contact between the two external electrodes if it makes contact with both external electrodes and is electrically conductive.

According to a further embodiment, the safety layer may extend essentially over the entire cross-sectional area of the piezo stack. According to a further embodiment, the method may further comprise the formation of at least one gap within the safety layer as the interruption. According to a further embodiment, the safety layer can be fabricated from an electrically insulating material. According to a further embodiment, the safety layer can be electrically conductive at first and becomes electrically insulating through the diffusing away of conductive components. According to a further embodiment, the safety layer may be less strong than the internal electrode layers.

BRIEF DESCRIPTION OF THE DRAWINGS

Exemplary embodiments are illustrated by way of example in the appended schematic drawings, in which:

FIG. 1 shows a perspective side view of a piezo stack,

FIG. 2 shows a flowchart illustrating the production of the piezo stack,

FIG. 3 shows a cross section through the piezo stack, and

FIGS. 4, 5 show cross sections through further piezo stacks.

DETAILED DESCRIPTION

According to various embodiments, in a piezo stack having alternately successive piezoelectric layers and internal electrode layers which are alternately connected electrically to two external electrodes which are arranged on the outer side of the piezo stack, at least one safety layer is arranged between two successive piezoelectric layers instead of one of the internal electrode layers, wherein the safety layer is structured in such a way that it has an internal interruption which is embodied in such a way that the safety layer does not form an electrical contact between the two external electrodes if it makes contact with both external electrodes and is electrically conductive.

According to other embodiments, in a method for producing a piezo stack which has alternately successive piezoelectric layers and internal electrode layers which are alternately connected electrically to two external electrodes which are arranged on the outer side of the piezo stack, at least one safety layer is arranged between two successive piezoelectric layers instead of one of the internal electrode layers, wherein the safety layer is structured in such a way that it has an internal interruption which is embodied in such a way that the safety layer does not form an electrical contact between the two external electrodes if it makes contact with both external electrodes and is electrically conductive.

The piezo stack according to various embodiments comprises the successive piezoelectric layers, the internal electrode layers and the two external electrodes. An internal electrode layer is therefore arranged between two successive piezoelectric layers. In addition, the internal electrode layers are alternately placed in contact with one of the two external electrodes. The external electrodes are arranged on the outer sides of the piezo stack, for example on, in each case, two outer sides lying opposite one another.

During the operation of the piezo stack, an electrical voltage is applied to the two external electrodes and is accordingly also alternately applied to the internal electrode layers, as a result of which the piezoelectric layer which lies between two internal electrode layers expands.

In order at least to reduce or even to prevent a risk of undesired formation of fractures within the piezo stack according to various embodiments, the piezo stack has the at least one safety layer which is arranged between two piezoelectric layers instead of one of the internal electrode layers.

In particular, the piezo stack according to various embodiments can have precisely one safety layer or a plurality of safety layers which respectively replace one of the internal electrode layers.

The safety layer can be of continuous design, i.e. it can extend essentially over the entire cross-sectional area of the piezo stack, and it is then generally connected to both external electrodes.

In order to ensure that the two external electrodes are not electrically short-circuited by the safety layer, according to various embodiments said safety layer is structured in such a way that it has at least one internal interruption which prevents an electrical short-circuit of the external electrodes if the safety layer is electrically conductive. In this way a short-circuit between the two external electrodes is reliably prevented even if the safety layer was produced at first from an electrically insulating material but becomes electrically conductive in the course of time.

The safety layer can be interrupted in the center, for example. Furthermore, the safety layer can be embodied in such a way that the piezo stack according to various embodiments can fracture selectively. In addition, the at least one interruption can be adapted to the mechanical stress distribution of the piezo stack according to various embodiments.

According to an embodiment of the piezo stack, the interruption within the safety layer is embodied as at least one gap. The safety layer then has at least two partial safety layers which are separated by the gap and which are accordingly electrically insulated from one another. If one of the partial safety layers is then connected to just one of the external electrodes, and the other partial safety layer is only connected to the other external electrode, an electrical short-circuit between the two external electrodes can be reliably prevented. If the safety layer is provided with a plurality of gaps, a short-circuit of the external electrodes can be prevented even if one of the gaps was not made sufficiently wide, for example for technical processing reasons.

According to one embodiment of the piezo stack, the safety layer is fabricated from an electrically insulating material. This is implemented, for example, by virtue of the fact that the safety layer is electrically conductive at first and becomes electrically insulating through the diffusing away of conductive components, for example during thermal processes during the production of the piezo stack according to various embodiments. A suitable material for the safety layer is, for example, silver-palladium.

According to one embodiment of the piezo stack, the safety layer is less strong than the internal electrode layers. The strength of the safety layer is, for example, less than approximately 30 MPa.

FIG. 1 shows a piezo stack 1 which is embodied in the form of a right parallelepiped in the present exemplary embodiment, FIG. 2 shows a flowchart illustrating the production of the piezo stack 1, and FIG. 3 shows a cross section through the piezo stack 1.

The piezo stack 1 has a plurality of piezoelectric layers 2 and a plurality of internal electrodes 3, 4 in the form of layers arranged between them. The piezoelectric layers 2 comprise a piezoceramic material, lead-zirconate-titanate in the present exemplary embodiment, and the internal electrodes 3, 4 are electrically conductive metal layers in the present exemplary embodiment.

An external electrode 7, 8 is arranged on each of the outer sides 5, 6 lying opposite one another in the present exemplary embodiment, which external electrodes 7, 8 have been applied as external metallizations along the outer sides 5, 6. In order that the external electrode 7 arranged on the outer side 5 makes contact with the internal electrodes 3 but not with the internal electrodes 4, in the present exemplary embodiment the internal electrodes 3 are made to extend continuously as far as the outer side 5, and the internal electrodes 4 are set back sufficiently into the interior of the piezo stack 1 in the region of the external electrode 7.

In order that the external electrode 8 arranged on the outer side 6 makes contact with the internal electrodes 4 but not with the internal electrodes 3, in the present exemplary embodiment the internal electrodes 4 are made to extend as far as the outer side 6, and the internal electrodes 3 are set back sufficiently into the interior of the piezo stack 1 in the region of the external electrode 8.

The external electrode 7 is therefore in contact with the internal electrodes 3, and the external electrode 8 is in contact with the internal electrodes 4, as a result of which the two external electrodes 7, 8 alternately make contact with the internal electrodes 3, 4.

The piezo stack 1 also has safety layers 9 which are arranged between two piezoelectric layers 2 instead of internal electrodes 3, 4. In the present exemplary embodiment, the safety layers 9 extend over the entire cross-sectional area of the piezo stack 1 and generally make contact with the two external electrodes 7, 8. FIG. 3 shows a plan view of one of the safety layers 9 which is structured as illustrated.

In the present exemplary embodied, the piezo stack 1 was produced by means of the process steps of stacking the individual piezoelectric layers 2, internal electrodes 3, 4 and the structured safety layers 9, step A in the flowchart, and by subsequently cutting, debinding and grinding, step B. Subsequently, in a step C, the external electrodes 7, 8 were arranged on the outer sides 5, 6.

As is apparent from FIG. 3, the individual safety layers 9 are structured in such a way that in the present exemplary embodiment they each have two partial safety layers 11, 12 which are separated by a gap 13.

In the present exemplary embodiment, the two external electrodes 7, 8 are arranged near to two edges 14, 15, lying diagonally opposite one another, of the piezo stack 1 on the outer sides 5, 6, and the gap 13 extends diagonally with respect to the two further edges 16, 17 of the piezo stack 1. Furthermore, the external electrode 7 makes contact with the partial safety layer 11, and the external electrode 8 makes contact with the partial safety layer 12. However, through their structuring, i.e. through the gap 13, the two partial safety layers 11, 12 are separated from one another, with the result that the safety layer 9 does not electrically connect the two external electrodes 7, 8 even if the safety layer 9 were to be electrically conductive.

In the present exemplary embodiment, the safety layers 9 are formed, for example, from silver-palladium. Through thermal processes during the production of the piezo stack 1, the safety layers 9 lose their conductivity due to diffusing away of conductive components. Nevertheless, if the safety layers 9 are conductive, even if only relatively slightly conductive, the two external electrodes 7, 8 are still not electrically connected by the safety layers 9 due to the gap 13. As a result, in particular even piezo stacks with a cross-sectional area of less than approximately 6.8×6.8 mm$^2$ can be produced in an operationally reliable way.

FIG. 4 shows an alternative embodiment of a safety layer 40 which can be used instead of the safety layer 9 for the safety stack 1.

In contrast to the safety layer 9 shown in FIG. 3, the safety layer 40 shown in FIG. 4 has three partial safety layers 41-43 and two gaps 44, 45. The partial safety layer 41 is connected here to the external electrode 8 and separated from the partial safety layer 42 by the gap 44. The partial safety layer 42 is separated from the partial safety layer 43 by the gap 45, and said partial safety layer 43 is in turn connected to the external electrode 7.

The gaps 13, 44, 45 which are illustrated in FIGS. 3, 4 are embodied in a strip shape in the illustrated exemplary embodiments. This is not absolutely necessary.

FIG. 5 shows an alternative embodiment of a safety layer 50 which can be used instead of the safety layer 9 for the piezo stack 1. In the present exemplary embodiment, the safety layer 50 has, like the safety layer 9, two partial safety layers 51, 52 which are separated from one another by a gap 53 which extends diagonally. The partial safety layer 51 is connected to the external electrode 8, and the partial safety layer 52 is connected to the external electrode 7.

In contrast to the gap 13 of the safety layer 9 which is illustrated in FIG. 3, the gap 53 is not embodied in a strip shape but rather tapers to its center. As a result, an improved mechanical distribution of stresses in the piezo stack 1 is obtained.

What is claimed is:

1. A piezo stack comprising:
   alternately successive piezoelectric layers and internal electrode layers which are alternately connected electrically to two external electrodes which are arranged on the outer side of the piezo stack on diagonally opposite edges, and
   at least one safety layer which is arranged between two successive piezoelectric layers instead of one of the internal electrode layers, wherein the safety layer is structured in such a way that it has an internal interruption which is embodied in such a way that the safety layer does not form an electrical contact between the two external electrodes if it makes contact with both external electrodes and is electrically conductive;
   wherein the internal interruption extends diagonally across the stack with respect to different edges than the two external electrodes.

2. The piezo stack according to claim 1, wherein the safety layer extends essentially over the entire cross-sectional area of the piezo stack.

3. The piezo stack according to claim 1, wherein the interruption is embodied as at least one gap within the safety layer.

4. The piezo stack according to claim 1, wherein the safety layer is fabricated from an electrically insulating material.

5. The piezo stack according to claim 1, wherein the safety layer is electrically conductive at first and becomes electrically insulating through the diffusing away of conductive components.

6. The piezo stack according to claim 1, wherein the safety layer is less strong than the internal electrode layers.

* * * * *